(12) United States Patent
Xu et al.

(10) Patent No.: US 11,284,119 B2
(45) Date of Patent: Mar. 22, 2022

(54) METHOD AND APPARATUS FOR DECODING VARIABLE-LENGTH CODED FILE

(71) Applicant: HUAWEI TECHNOLOGIES CO., LTD., Guangdong (CN)

(72) Inventors: Yuqiong Xu, Hangzhou (CN); Zhenkun Zhou, Hangzhou (CN); Tao Yu, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 417 days.

(21) Appl. No.: 16/241,058

(22) Filed: Jan. 7, 2019

(65) Prior Publication Data

US 2019/0141356 A1    May 9, 2019

Related U.S. Application Data

(63) Continuation of application No. PCT/CN2017/091866, filed on Jul. 5, 2017.

(30) Foreign Application Priority Data

Jul. 8, 2016 (CN) .......................... 201610542045.0

(51) Int. Cl.
*G06K 9/00* (2006.01)
*H04N 19/91* (2014.01)
(Continued)

(52) U.S. Cl.
CPC .............. *H04N 19/91* (2014.11); *H03M 7/40* (2013.01); *H03M 7/42* (2013.01); *H04N 19/436* (2014.11); *H04N 19/45* (2014.11); *H04N 19/60* (2014.11)

(58) Field of Classification Search
None
See application file for complete search history.

(56) References Cited

U.S. PATENT DOCUMENTS

| | | |
|---|---|---|
| 5,381,145 A | 1/1995 | Allen et al. |
| 6,043,765 A | 3/2000 | Twardowski |
| (Continued) | | |

FOREIGN PATENT DOCUMENTS

| | | |
|---|---|---|
| CN | 101051846 A | 10/2007 |
| CN | 101147325 A | 3/2008 |
| (Continued) | | |

OTHER PUBLICATIONS

S. T. Klein et al., Parallel Huffman Decoding with Applications to JPEG Files. The Computer Journal, vol. 46, No. 5, 2003, 11 pages.

(Continued)

*Primary Examiner* — Soo Jin Park
(74) *Attorney, Agent, or Firm* — Conley Rose, P.C.

(57) ABSTRACT

The present disclosure provides a decoding method and apparatus. The decoding method mainly includes: extracting pre-indexed information, storing the pre-indexed information in another file associated with a to-be-decoded file or a tail end of the to-be-decoded file, then reading the pre-indexed information before decoding is performed, and performing parallel decoding on multiple data segments in the to-be-decoded file according to the pre-indexed information. Using the foregoing storage method for the pre-indexed information may effectively reduce an I/O operation when the pre-indexed information is read, so as to avoid, to some extent, a system frame freezing phenomenon that may be caused when decoding is performed.

21 Claims, 10 Drawing Sheets

(51) Int. Cl.
*H03M 7/40* (2006.01)
*H03M 7/42* (2006.01)
*H04N 19/436* (2014.01)
*H04N 19/44* (2014.01)
*H04N 19/60* (2014.01)

(56) References Cited

U.S. PATENT DOCUMENTS

| | | | |
|---|---|---|---|
| 8,520,958 | B2 | 8/2013 | Singh et al. |
| 2006/0145898 | A1 | 7/2006 | Jahanghir et al. |
| 2006/0269147 | A1 | 11/2006 | Shen et al. |
| 2008/0198177 | A1 | 8/2008 | Niemi et al. |
| 2011/0125722 | A1 | 5/2011 | Rao et al. |
| 2011/0248872 | A1* | 10/2011 | Korodi .............. H03M 7/40 341/67 |
| 2012/0081242 | A1 | 4/2012 | He et al. |
| 2013/0275688 | A1 | 10/2013 | Luo |
| 2013/0330013 | A1 | 12/2013 | Singh et al. |

FOREIGN PATENT DOCUMENTS

| | | |
|---|---|---|
| CN | 101647288 A | 2/2010 |
| CN | 101859585 A | 10/2010 |
| CN | 101626504 B | 6/2012 |
| CN | 102761745 A | 10/2012 |
| CN | 102970544 A | 3/2013 |
| CN | 103377131 A | 10/2013 |
| CN | 103297767 B | 3/2016 |
| CN | 105578194 A | 5/2016 |
| EP | 2381685 A1 | 10/2011 |
| GN | 1971734 A | 5/2007 |

OTHER PUBLICATIONS

S.T. Klein et al., Parallel Huffman decoding. Proceedings DCC 2000. Data Compression Conference, Aug. 6, 2002, 10 pages.

Guan-Wei Chiu, GPU Decoding of Motion JPEG and Huffman Data Stream. Ming Chuan University, Computer and communication engineering, 2011, 93 pages.

Foreign Communication From A Counterpad Application, European Application No. 17823645.1, Extended European Search Report dated May 23, 2019, 1 page.

Foreign Communication From A Counterpad Application, European Application No. 17823645.1, Supplementary European Search Report dated May 15, 2019, 2 pages.

Foreign Communication From A Counterpad Application, European Application No. 17823645.1, Search Opinions dated May 23, 2019, 6 pages.

* cited by examiner

METHOD AND APPARATUS FOR DECODING VARIABLE-LENGTH CODED FILE

CROSS-REFERENCE TO RELATED APPLICATIONS

This application is a continuation of International Application No. PCT/CN2017/091866, filed on Jul. 5, 2017, which claims priority to Chinese Patent Application No. 201610542045.0, filed on Jul. 8, 2016. The disclosures of the aforementioned applications are hereby incorporated by reference in their entireties.

TECHNICAL FIELD

Embodiments of the present disclosure relate to a computer decoding method, and in particular, to a method and an apparatus for decoding a variable-length coded file.

BACKGROUND

Currently, a most popular image format in mobile devices is Joint Photographic Experts Group (JPEG). A JPEG-based image is obtained by means of variable-length Huffman entropy coding, and therefore better image quality may be obtained by using relatively less disk space. Images generated by means of photographing by devices such as a mobile phone and a camera are in the JPEG format by default. In addition, images that are saved after being edited by most image editing software are also in the JPEG format by default.

Improving a speed of decoding a JPEG image can significantly improve user experience for browsing the image. Currently, a mobile terminal mainly uses two manners to complete decoding of the JPEG image. The first manner is hardware decoding, that is, a dedicated hardware chip is set in the mobile terminal to complete decoding of the JPEG image, for example, an Apple iOS device. The second manner is software decoding in which a software decoding library is used to complete decoding of the JPEG image, for example, most Android devices. Hardware decoding has an advantage of a rapid decoding speed, but a decoding chip needs to be additionally added to a device. This increases costs of the device. Therefore, a technology that can improve a speed of software decoding is urgently required, so as to improve user experience for browsing the image without increasing production coats of the device.

A software decoding process of the JPEG image mainly includes three processes: Huffman entropy decoding, inverse discrete cosine transform, and color transform. The two processes of inverse discrete cosine transform and color transform can well support parallelization and multi-thread processing. However, Huffman entropy coding is one type of variable-length coding (VLC). When decoding is performed, a decoding boundary cannot be accurately found and multi-thread parallel processing is further performed. Therefore, usually, only single-thread serial decoding can be performed.

In the prior art, there is a Huffman parallel decoding method. A core of the method is that offset information that is of a decoding boundary of a to-be-decoded file and that is in the file is inserted into a header of the file, so that when decoding is performed, the decoding boundary may be obtained by parsing the header, so as to implement parallel decoding. However, in the method, when the foregoing offset information is inserted into the header of the file, an entire file stream needs to be replicated. Therefore, when the JPEG image is relatively large or there are many JPEG images, many input/output (I/O) operations are required, and a system frame freezing phenomenon or even a system apparent death phenomenon due to excessively frequent I/O operations of the mobile device may occur.

SUMMARY

Embodiments of the present disclosure provide a method and an apparatus for decoding a variable-length coded file, so as to improve a speed of decoding a file and avoid, to some extent, a system frame freezing phenomenon that may be caused when the file is decoded.

The following first describes terms used in the embodiments of the present disclosure.

Metadata: Generalized metadata refers to data that describes data. Metadata of a file may be stored independently of the file, or may be stored in the file, for example, a header of the file or a tail end of the file.

Metadata file: a file that stores the metadata. A metadata file corresponding to a file refers to a file that stores metadata of the file, and the file and the metadata file of the file are two different files.

Database file: a file that stores data of a database, for example, a file that is provided by an SQL server database and whose extension is .mdf.

System file: a file that stores main data of an operating system and that cannot be directly modified by a user, for example, a metadata file of a Linux system. The metadata file of the Linux system includes some metadata files for describing a feature of a user file, and the metadata file has an association relationship with the user file described by the metadata file.

User file: a file that is directly created by the user or an application and that can be directly modified by the user. A to-be-decoded file mentioned in the embodiments of the present disclosure is usually a user file, for example, an image file obtained by means of photographing by the user by using a terminal device.

File stream: a form in which the image file or another type of file is stored in a memory of a computer. Operations of adding data, deleting data, modifying data, coding and/or decoding that are performed on the file are completed by means of operations performed on the file stream. Before decoding is performed on a file, the file needs to be first loaded to the memory of the computer, and therefore, performing decoding on the file may be also referred to as performing decoding on a file stream corresponding to the file.

Parallel decoding: Multiple (at least two) threads simultaneously perform a decoding operation on data in the foregoing file stream.

Minimum coded unit (MCU): In the JPEG coding specification, a minimum processed unit is an MCU and is usually a matrix of 16*16 pixels. However, in some image formats (for example, a greyscale image), the MCU may be a matrix of 8*8 pixels. A JPEG image of an ordinary size generally includes thousands of MCUs, that is, a to-be-decoded file stream corresponding to the image includes information about thousands of coded MCUs. Because the JPEG is obtained by means of variable-length Huffman coding, lengths of coded MCUs obtained by using MCUs of a same size are unknown, and may be the same, or may be different.

Data segment: Data in the foregoing file stream includes multiple (at least two) data segments, and in a parallel decoding process, multiple threads respectively perform a decoding operation on the multiple data segments. If parallel decoding is performed on a per-MCU basis, excessive threads need to be simultaneously started. Therefore, generally, one data segment includes multiple MCUs, so that a quantity of threads that need to be simultaneously started may be reduced.

Decoding boundary: A boundary between the foregoing data segments is a decoding boundary. Specifically, the decoding boundary may be a start location of each data segment. More specifically, in some embodiments, the decoding boundary is the first MCU included in each data segment. It should be noted that, although the first MCU of the entire file stream, that is, the first location of the file, is not a boundary between two data segments, the first MCU is a decoding boundary in some embodiments of the present disclosure.

Pre-indexed information: The pre-indexed information includes information indicating one or more decoding boundaries, and may further include some other information according to an actual requirement for decoding. In some embodiments, information about the decoding boundary is offset location information of the decoding boundary in the file stream. More specifically, in a to-be-decoded file stream, the information about the decoding boundary may be offset location information that is of the first MCU included in each data segment and that is in the file stream. It should be noted that, a data segment on which parallel decoding is to be performed can be usually obtained by dividing according to a decoding boundary only after the decoding boundary is determined. However, a quantity of to-be-divided data segments (and a quantity of decoding boundaries that is related to the quantity), that is, a quantity of threads that perform parallel decoding may be determined according to information such as a current processing capability of a processing resource before the data segment is obtained.

Persistent storage: After a computer is powered off or restarted, stored information is not lost. Typical persistent storage includes file storage and database storage.

According to a first aspect, an embodiment of the present disclosure provides a decoding method, where the method may be applied to decoding of a file that is obtained by means of variable-length coding, for example, a JPEG image. The decoding method includes: reading pre-indexed information corresponding to a to-be-decoded file; and performing parallel decoding on multiple data segments in the to-be-decoded file according to the pre-indexed information. The pre-indexed information includes information indicating one or more decoding boundaries, and the multiple data segments are divided according to one or more of the one or more decoding boundaries.

Based on the first aspect, in a first implementation, the pre-indexed information is stored in another file associated with the to-be-decoded file. In other words, the pre-indexed information is stored independently of the to-be-decoded file. For example, the pre-indexed information may be stored in a metadata file corresponding to the to-be-decoded file. Herein, metadata refers to system data corresponding to the to-be-decoded file. Herein, the metadata file is a system file. In the storage method, because an operation of replicating an entire file is not involved, a reading operation and a writing operation do not need to be performed on a hard disk (or another external memory) for the entire file, and only the pre-indexed information that has less data than the file needs to be written into the hard disk, so as to effectively reduce an I/O operation and further avoid, to some extent, a system frame freezing phenomenon that may be caused when decoding is performed. Particularly, when there are many files or the file is relatively large, an effect is more significant.

Based on the first implementation of the first aspect, in some implementations, the another file may also be a database file. Herein, the database may be a local database, or may be a remote database. In some other implementations, the another file may also be a file that belongs to a same directory as the to-be-decoded file and that has a same file name as the to-be-decoded file and an extension different from that of the to-be-decoded file, and the extension of the another file cannot conflict with an existing extension.

Based on the first aspect, in a second implementation, the pre-indexed information may be further stored in a tail end of the to-be-decoded file. Because a file system supports an operation of appending data to the tail end, by using a storage manner in which data is stored in the tail end of the file, an operation of replicating a file stream corresponding to the entire file may be avoided, so as to effectively reduce an I/O operation and further avoid, to some extent, a system frame freezing phenomenon that may be caused when decoding is performed.

Based on any one of the first aspect or the foregoing implementations, in some implementations, the pre-indexed information is obtained and stored in the following manner: When it is detected that the to-be-decoded file is opened for the first time, extracting the pre-indexed information; and storing the extracted pre-indexed information. The storage includes persistent storage. For a specific storage location, refer to a storage location of the pre-indexed information described in the foregoing implementation. Specifically, a process of extracting the pre-indexed information includes performing decoding on the to-be-decoded file with respect to variable-length coding.

In some implementations, when it is detected that the to-be-decoded file is opened for the first time, extracting the pre-indexed information means that the pre-indexed information is extracted by performing decoding when the file is opened for the first time (another decoding method such as serial decoding or region decoding). Because decoding needs to be performed with respect to variable-length coding when the file is opened for the first time, for a file that is obtained by means of variable-length coding, information about a coded unit may be obtained by performing the decoding, and then information about some coded units is selected from the obtained information about the coded unit as the pre-indexed information. When the file is opened for the first time, the pre-indexed information is extracted. In this way, there is no extra power consumption or overheads for the system, and when the file is opened again afterwards, parallel decoding may be performed according to the pre-indexed information, so as to improve a decoding speed when the file is opened afterwards.

In some other implementations, extracting the pre-indexed information may be performed when it is detected that the to-be-decoded file is newly added or that the to-be-decoded file is modified. In the two implementations, because the file does not need to be opened, in the process of extracting the pre-indexed information, only decoding may be performed for variable-length coding, and not all processing processes of opening a file are performed, for example, processes of inverse discrete cosine transform and color transform in a process of opening the JPEG image.

Three conditions described in the foregoing implementation may be all set by the system. For example, the system sets that when any one of the three conditions is met, a step of extracting the pre-indexed information is performed, unless it is known that the file already has the pre-indexed information. Alternatively, the system may set only one or two of the three conditions. For example, the system sets that when it is detected that the file is opened for the first time, a step of extracting the pre-indexed information is performed for the file, and also sets that when it is detected that the file is modified, a step of extracting the pre-indexed information is performed for the file. This setting can improve parallel decoding efficiency for the original file, modify the pre-indexed information in a timely manner after the original file is modified, so as to ensure accuracy of the pre-indexed information and ensure that relatively good parallel decoding efficiency can still be achieved for a modified file.

In some other implementations, the computer system may autonomously start an operation of extracting the pre-indexed information. For example, by default, the system may extract the pre-indexed information at a fixed interval, or extract pre-indexed information for x files each time x files are newly added, where x is an integer greater than 2.

In some implementations, before the pre-indexed information is extracted, a quantity of decoding boundaries that need to be stored is determined according to a processing capability of a processing resource. Herein, the processing resource includes a local processing resource of a computer system in which the to-be-decoded file is located, and/or a non-local processing resource that can be invoked by the computer system. Specifically, a quantity of threads that can perform parallel processing is determined according to the processing capability of the processing resource. The extracted pre-indexed information includes information about decoding boundaries whose quantity is equal to the quantity of threads. It is assumed that a current CPU in the system has four cores, the quantity of threads that can perform parallel processing is 4, and information about four decoding boundaries including first location information of the file or information about three decoding boundaries excluding first location information of the file may be extracted and stored. The JPEG image is used as an example. The first location information of the file is offset location information of the first MCU block in the file. In addition, it should be noted that, an amount of pre-indexed information that is extracted and stored may be not exactly equal to and merely close to the quantity of threads that can perform parallel processing. This may avoid storing information about an excessive quantity of decoding boundaries, thereby effectively saving storage space. Certainly, the processing capability of the processing resource may be determined, and information about a corresponding quantity of decoding boundaries is stored only after extracting is performed, and before storing is performed.

Based on any one of the first aspect or the foregoing implementations, in some implementations, the pre-indexed information corresponding to the to-decoded file is read only when it is determined that a size of the to-be-decoded file is greater than a preset first threshold, and parallel decoding is performed according to the pre-indexed information. Specifically, in an implementation, it is first determined whether the size of the to-be-decoded file is greater than the preset first threshold. When the size of the to-be-decoded file is greater than (or greater than or equal to) the preset first threshold, the pre-indexed information corresponding to the to-be-decoded file is further read, and parallel decoding is performed according to the pre-indexed information. When the size of the to-be-decoded file is less than or equal to (or less than) the preset first threshold, parallel decoding is not performed, but serial decoding is performed.

If the file is excessively small, benefits brought by parallel decoding are less than costs. Therefore, in the solution provided in this embodiment of the present disclosure, the size of the file may be first determined, and parallel decoding is performed only on a relatively large file, so as to improve efficiency of decoding the relatively large file and improve overall resource utilization of the system.

Based on any one of the foregoing manners of extracting the pre-indexed information, in some implementations, even if it is detected that the to-be-decoded file is newly added, modified, or opened for the first time, it still needs to be determined that the size of the to-be-decoded file is greater than the preset first threshold, and then the pre-indexed information is further extracted according to a determining result. Specifically, in an implementation, it is first determined whether the size of the to-be-decoded file is greater than the preset first threshold, and the pre-indexed information is extracted only when the size of the to-be-decoded file is greater than the preset first threshold. When the size of the to-be-decoded file is less than or equal to the preset first threshold, an operation needs to be performed according to an actual requirement of the file. If the file actually needs to be decoded, for example, when the file is opened for the first time, the file needs to be decoded anyhow. In this case, although the pre-indexed information is not obtained, a series of operations such as serial decoding or region decoding need to be performed on the file, so as to open the file. If the file actually does not need to be decoded, for example, if the file is newly added or modified, any operation related to decoding may not be performed on the file.

Before the pre-indexed information is extracted, the size of the file is considered, and the pre-indexed information is extracted and stored only for the relatively large file. This may further save storage space without affecting the overall resource utilization of the system.

In some other manners, before the step of extracting the pre-indexed information and before reading the pre-indexed information of the to-be-decoded file, a step of determining the size of the file may be performed.

In some implementations, the preset first threshold may be determined according to experience, or may be determined according to a decoding effect after a large quantity of files of various sizes are decoded. Once the threshold is determined, the threshold generally does not change.

In some other implementations, the preset first threshold may be changed according to an actual situation. Specifically, the preset first threshold may be changed in the following manner: after decoding of each to-be-decoded file is completed, related information of the to-be-decoded file is recorded and includes the size and a decoding time of the file, and whether parallel decoding is performed. If parallel decoding is performed on the to-be-decoded file, the decoding time is less than a preset second threshold (for example, 1 ms), and the size of the to-be-decoded file is greater than the preset first threshold, the preset first threshold is changed to the size of the to-be-decoded file. In other words, if it is found that parallel decoding is performed on a to-be-decoded file and a decoding time is excessively short, this proves that an effect of performing parallel decoding on a file of this size is insignificant, and an effect of performing parallel decoding on a file whose size is less than that of the file may be less insignificant. If the size of the file is greater than the first threshold, the first threshold should be set as the size of the file, and in this case, the first threshold may be changed in a timely manner according to an actual situation, so as to further ensure the overall resource utilization of the system.

In some other implementations, not related information of each file needs to be recorded, only related information of files whose decoding time is less than a threshold is recorded. This may save storage space.

Based on any one of the first aspect or the foregoing implementations, in some implementations, some data preparations need to be made before parallel decoding is performed on the to-be-decoded file. Specifically, it is assumed that the current system can start R threads in parallel, a replication operation (only a pointer of the file stream needs to be replicated) is performed on a file stream of the to-be-decoded file to obtain R file streams. In this case, each thread may perform parallel decoding on a data segment in the file stream that is visible to the thread, and finally, execution results of the R threads are synchronized to obtain a final decoding result. This may avoid a problem of mutual interference between threads, ensuring accuracy of a parallel decoding result. Further, data preparation further includes preparing other data that is required in a parallel decoding process, for example, creating one or more decoding structures.

Based on any one of the first aspect or the foregoing implementations, in some implementations, after the pre-indexed information is obtained, integrity verification first needs to be performed on the pre-indexed information, and if the verification succeeds, parallel decoding is then performed on the to-be-decoded file according to the pre-indexed information. If the verification fails, it indicates that the pre-indexed information may be lost or modified, and in this case, serial decoding is performed on the to-be-decoded file. This may avoid a parallel decoding failure that is caused because the pre-indexed information of the file is lost or modified.

Based on any one of the first aspect or the foregoing implementations, in some implementations, when a quantity of threads is equal to a quantity of data segments that may be divided according to the decoding boundary, a complete data segment between every two decoding boundaries is an object to be decoded by one thread. In this case, the parallel decoding process includes: determining a location of each decoding boundary in the to-be-decoded file according to information about multiple decoding boundaries in the pre-indexed information; and determining, by each thread of the multiple threads, one decoding boundary, and starting to perform decoding from the location of the decoding boundary in the to-be-decoded file, where other than a thread (referred to as a last thread) that performs decoding on a last data segment, each thread stops when arriving at a next decoding boundary, and the last thread performs decoding until arriving at a location at which the file (or the file stream) ends.

In some other implementations, during parallel decoding, when the quantity of threads that can be started is less than the quantity of data segments that may be divided according to the decoding boundary, other than the last thread, each thread processes P/M (rounding off) data segments, and the last thread processes a remaining part. M is the quantity of threads, and P is the quantity of data segments that may be divided according to the decoding boundary, or is the quantity of decoding boundaries in some implementations.

Based on any one of the first aspect or the foregoing implementations, in some implementations, the quantity of threads that perform parallel decoding may be dynamically changed according to an actual situation of the processing resource in the parallel decoding process. Specifically, a current available processor (for example, a quantity of idle cores) is dynamically detected, and the quantity of threads is then adjusted (for example, the quantity is increased), so as to further improve decoding efficiency.

According to a second aspect, an embodiment of the present disclosure further provides a decoding apparatus, including one or more modules that can implement any one of the first aspect or the foregoing implementations of the first aspect, where each module can perform one or more steps.

According to a third aspect, an embodiment of the present disclosure further provides a terminal device. The terminal device includes a processor and a memory, where the memory is configured to store a software program, and the processor is configured to read the software program stored in the memory and implement the method according to any one of the first aspect or the foregoing implementations of the first aspect.

According to a fourth aspect, an embodiment of the present disclosure further provides a computer storage medium, where the storage medium may be non-volatile, that is, content is not lost after the storage medium is powered off. The storage medium stores a software program, and when being read and executed by one or more processors, the software program can implement the method according to any one of the first aspect or the foregoing implementations of the first aspect.

It should be noted that, the method and the apparatus that are provided in the embodiments of the present disclosure may be applied to all image formats to which variable-length coding (Huffman) is applied. The JPEG image is a current image format to which variable-length coding is applied. The method provided in the embodiments of the present disclosure may be applied to decoding of another image to which variable-length coding is applied or decoding of an image that may emerge in the future and to which variable-length coding is applied. In addition to the file in the image format, if variable-length coding is applied to another type of file such as a text, an audio, and a video, a method that is the same as or similar to the method provided in the embodiments of the present disclosure may also be used for decoding.

BRIEF DESCRIPTION OF DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and a person of ordinary skill in the art may still derive other drawings from these accompanying drawings without creative efforts.

FIG. 5b is a schematic structural diagram of a 2D engine in the computer system provided in FIG. 5a;

DESCRIPTION OF EMBODIMENTS

The following clearly describes the technical solutions in the embodiments of the present disclosure with reference to the accompanying drawings in the embodiments of the present disclosure. Apparently, the described embodiments are merely some but not all of the embodiments of the present disclosure. All other embodiments obtained by a person of ordinary skill in the art based on the embodiments of the present disclosure without creative efforts shall fall within the protection scope of the present disclosure.

A decoding method provided in the embodiments of the present disclosure is mainly applied to a terminal device, and the terminal device may also be referred to as user equipment (UE), a mobile station (MS), a mobile terminal, and the like. Optionally, the terminal may have a capability of communicating with one or more core networks by using a radio access network (RAN). For example, the terminal may be a mobile phone (or referred to as a "cellular" phone) or a computer having an attribute of mobility, or the like. For example, the terminal may be further a portable, pocket-sized, handheld, computer built-in, or in-vehicle mobile apparatus. It should be understood that, in addition to the terminal device, the decoding method provided in the embodiments of the present disclosure may also be applied to another type of computer system.

A parallel computing capability of the computer is used in the decoding method provided in the embodiments of the present disclosure.

In the embodiments of the present disclosure, the parallel computing capability of the computer is used, so that parallel decoding of a variable-length coded file is implemented at a software level and a speed of decoding the file is improved. The following embodiments specifically describe that an operating system layer of the computer provides a capability of decoding a file in parallel. Further, optionally, the operating system layer may provide the parallel decoding capability for an application layer, so as to improve a speed of decoding a file of an application (for example, a graphics library) in the application layer and improve user experience for the application.

Figure 1:
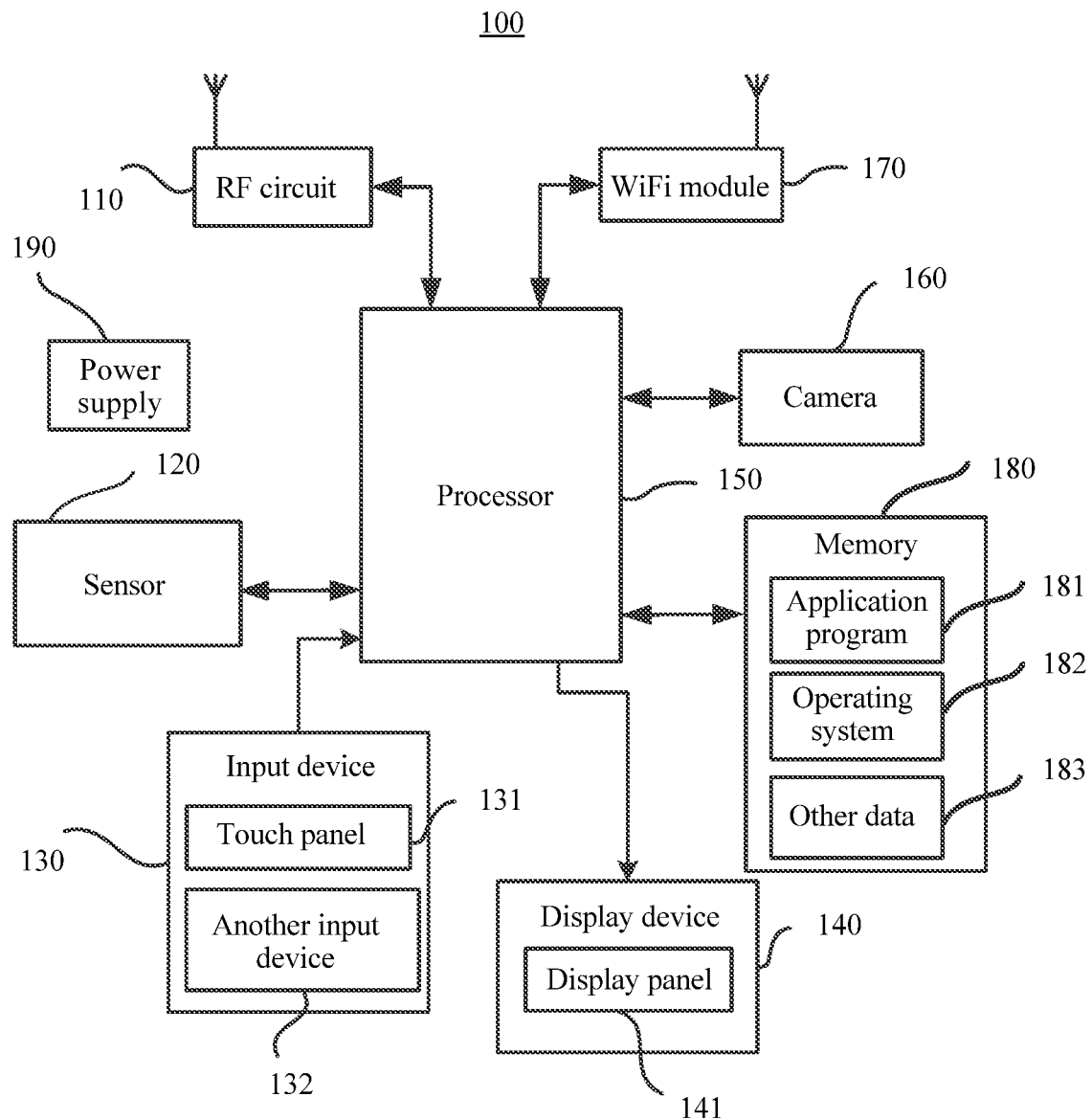
FIG. 1 is a schematic structural diagram of a terminal device to which an embodiment of the present disclosure is applied.

Referring to FIG. 1, FIG. 1 is a schematic structural diagram of a terminal device to which an embodiment of the present disclosure is applied. As shown in FIG. 1, a terminal device 100 includes a memory 180, a processor 150, and a display device 140, The memory 180 stores a computer program, and the computer program includes an operating system program 182, an application program 181, and the like. The processor 150 is configured to read the computer program in the memory 180, and then execute a method defined by the computer program. For example, the processor 150 reads the operating system program 182, so as to run the operating system and implement various functions of the operating system on the terminal device 100, or reads one or more application programs 181, so as to run the application on the terminal device.

The processor 150 may include one or more processors, for example, the processor 150 may include one or more central processing units, or include one central processing unit and one graphics processor. When the processor 150 includes multiple processors, the multiple processors may be integrated into a same chip, or each may be an independent chip. One processor may include one or more processing cores. All the following embodiments provide description by using multiple cores as an example, but the parallel decoding method provided in this embodiment of the present disclosure may also be applied to a single-core processor. Parallel decoding is performed by using a timeshare operating principle of the single-core processor, and a quantity of threads that perform parallel decoding may be determined according to current load of the single-core processor.

In addition, the memory 180 further stores other data 183 in addition to the computer program, and the other data 183 may include data generated after the operating system 182 or the application program 181 runs. The data includes system data (for example, a configuration parameter of the operating system) and user data. For example, an image shot by a user is typical user data, and is also a decoding object in the method provided in this embodiment of the present disclosure.

The memory 180 generally includes an internal memory and an external memory. The internal memory may be a random access memory (RAM), a read-only memory (ROM), a cache, or the like. The external memory may be a hard disk, an optical disc, a USB flash drive, a floppy disk, a tape drive, or the like. The computer program is generally stored in the external memory, and before performing processing, the processor loads the computer program from the external memory into the internal memory. A to-be-decoded file in this embodiment of the present disclosure is generally stored in the external memory, and before decoding the file, the processor loads the file from the external memory into the internal memory.

The operating system program 182 includes a computer program that can implement the parallel decoding method provided in this embodiment of the present disclosure, so that after the processor 150 reads the operating system program 182 and runs the operating system, the operating system may have a parallel decoding function according to this embodiment of the present disclosure. Further, the operating system can open a call interface of the parallel decoding function to an upper-layer application. After the processor 150 reads the application program 181 from the memory 180 and runs the application, for example, a graphics library application, the application can invoke, by using the call interface, the parallel decoding function provided in the operating system, so as to implement parallel decoding for the file.

The terminal device 100 may further include an input device 130, configured to: receive digital information or character information that is input, or a contact touch operation/non-contact gesture; and generate signal input that is related to a user setting and function control of the terminal device 100. Specifically, in this embodiment of the present disclosure, the input device 130 may include a touch panel 131. The touch panel 131, also referred to as a touchscreen, may collect a touch operation (such as an operation performed by the user on or near the touch panel 131 by using any appropriate object or accessory, such as a finger or a stylus) of the user on or near the touch panel 131, and drive a corresponding connection apparatus according to a preset program. Optionally, the touch panel 131 may include two parts: a touch detection apparatus and a touch controller. The touch detection apparatus detects a touch orientation of the user, detects a signal brought by the touch operation, and sends the signal to the touch controller. The touch controller receives touch information from the touch detection apparatus, converts the touch information into touch point coordinates, and then sends the touch point coordinates to the processor 150. The touch controller can further receive and execute a command sent by the processor 150. For example, if the user taps an image on the touch panel 131 with a finger, the touch detection apparatus detects a signal brought by the tap, and then sends the signal to the touch controller. Then, the touch controller converts the signal into coordinates, and sends the coordinates to the processor 150; and the processor 150 performs an operation such as decoding on the image according to the coordinates and a signal type (tap or double-tap), and finally displays the image on a display panel 141, so as to "open" the image.

The touch panel 131 may be implemented in multiple types, such as a resistive type, a capacitive type, infrared, and a surface acoustic wave. In addition to the touch panel 131, the input device 130 may further include another input device 132. The another input device 132 may include but is not limited to one or more of a physical keyboard, a function key (such as a volume control key or an on/off key), a trackball, a mouse, a joystick, or the like.

The terminal device 100 may further include a display device 140, The display device 140 includes a display panel 141, configured to display information that is input by the user, information provided for the user, various menu interfaces of the terminal device 100, and the like. In this embodiment of the present disclosure, the display device 140 is mainly configured to display a decoded image or another type of file. The display device 140 may include the display panel 141, and optionally, the display panel 141 may be configured in a form of an Liquid Crystal Display (LCD), an Organic Light-Emitting Diod (OLED), or the like. In some other embodiments, the touch panel 131 may cover the display panel 141, so as to form a touch display screen.

In addition, the terminal device 100 may further include: a power supply 190 configured to supply power to another module, and a camera 160 configured to shoot an image or a video. The terminal device 100 may further include one or more sensors 120, for example, an acceleration sensor or an optical sensor. The terminal device 100 may further include a radio frequency (RF) circuit 110, configured to communicate with a wireless network device by using a network, or may further include a WiFi module 170, configured to communicate with another device by using WiFi.

The following embodiment describes the decoding method provided in this embodiment of the present disclosure by using decoding of a JPEG image as an example. The decoding method provided in this embodiment of the present disclosure may be implemented in the operating system program 182 shown in FIG. 1. It should be understood that, the method provided in this embodiment of the present disclosure is not limited to decoding of the JPEG image.

Figure 2:
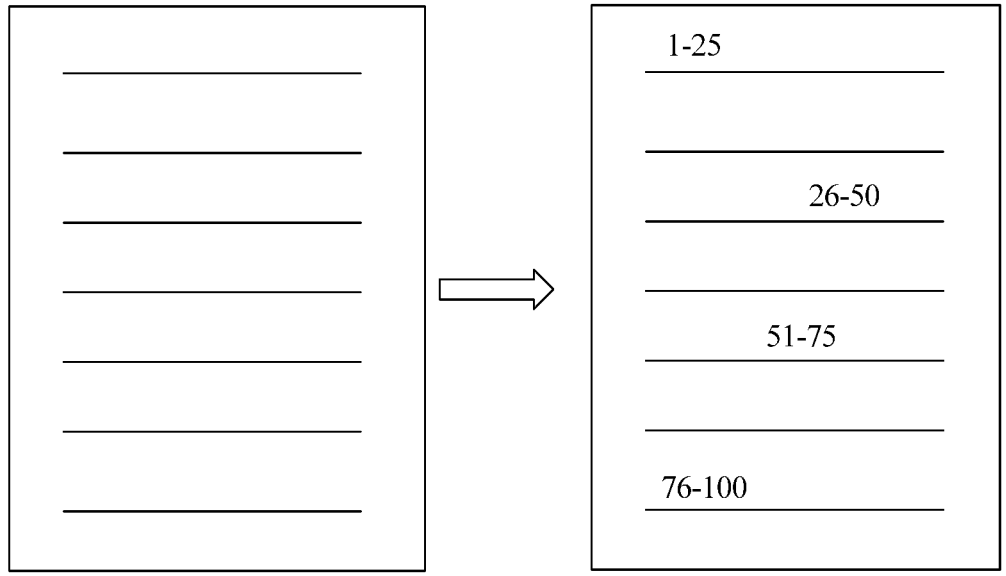
FIG. 2 is an example diagram of a decoding method according to an embodiment of the present disclosure.
Figure 2:
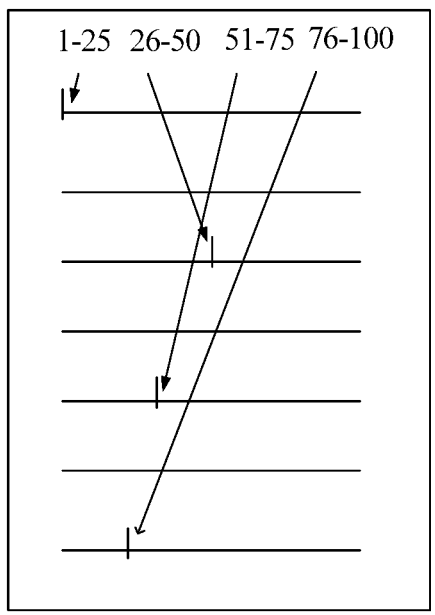
Figure 2:
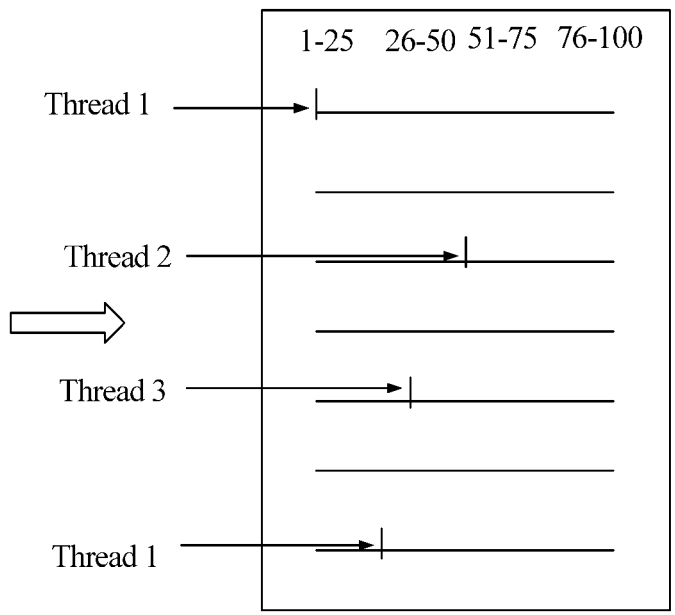

Referring to FIG. 2, FIG. 2 is an example diagram of a decoding method according to an embodiment of the present disclosure. In the JPEG standard, the biggest obstacle to parallelization is Huffman entropy decoding. Huffman entropy decoding takes at least half of overall time. Because each minimum coded unit is obtained by means of variable-length entropy coding, a start location of each MCU cannot be perceived before decoding, and parallel decoding cannot be implemented. It is assumed that there are 100 MCUs (numbers are 1 to 100) in a to-be-decoded image, and before the parallel decoding solution provided in this embodiment of the present disclosure is used, an original Huffman entropy decoding procedure is performing single-thread serial decoding on the 100 MCUs. A main concept of a JPEG parallel decoding solution is dividing the to-be-decoded image into multiple data segments, and storing information about a start point of each data segment by recording pre-indexed information.

Specifically, in the solution provided in this embodiment of the present disclosure, Huffman serial decoding is performed once on the to-be-decoded image in advance, and pre-indexed information obtained by means of serial decoding is extracted and recorded. The pre-indexed information is start location information of four data segments in an example in FIG. 2, the four data segments are respectively sets of MCUs whose numbers are 1 to 25, 26 to 50, 51 to 75, and 76 to 100, and start location information of the four data segments is respectively location information of MCUs whose numbers are 1, 26, 51, and 76. Generally, location information of the MCU is represented by offset location information that is of the MCU and that is in a file stream corresponding to the image, and the offset location information may be an offset of the MCU relative to a first byte of a file, or may be an offset of the MCU relative to a first MCU of a file. After offset location information of the four MCUs is obtained, a thread 1 to a thread 4 may respectively start, from locations of the four MCUs, performing decoding on the four data segments in parallel, thereby improving a speed of decoding the image.

The following describes the decoding method provided in this embodiment of the present disclosure by using a more detailed method process.

Figure 3:
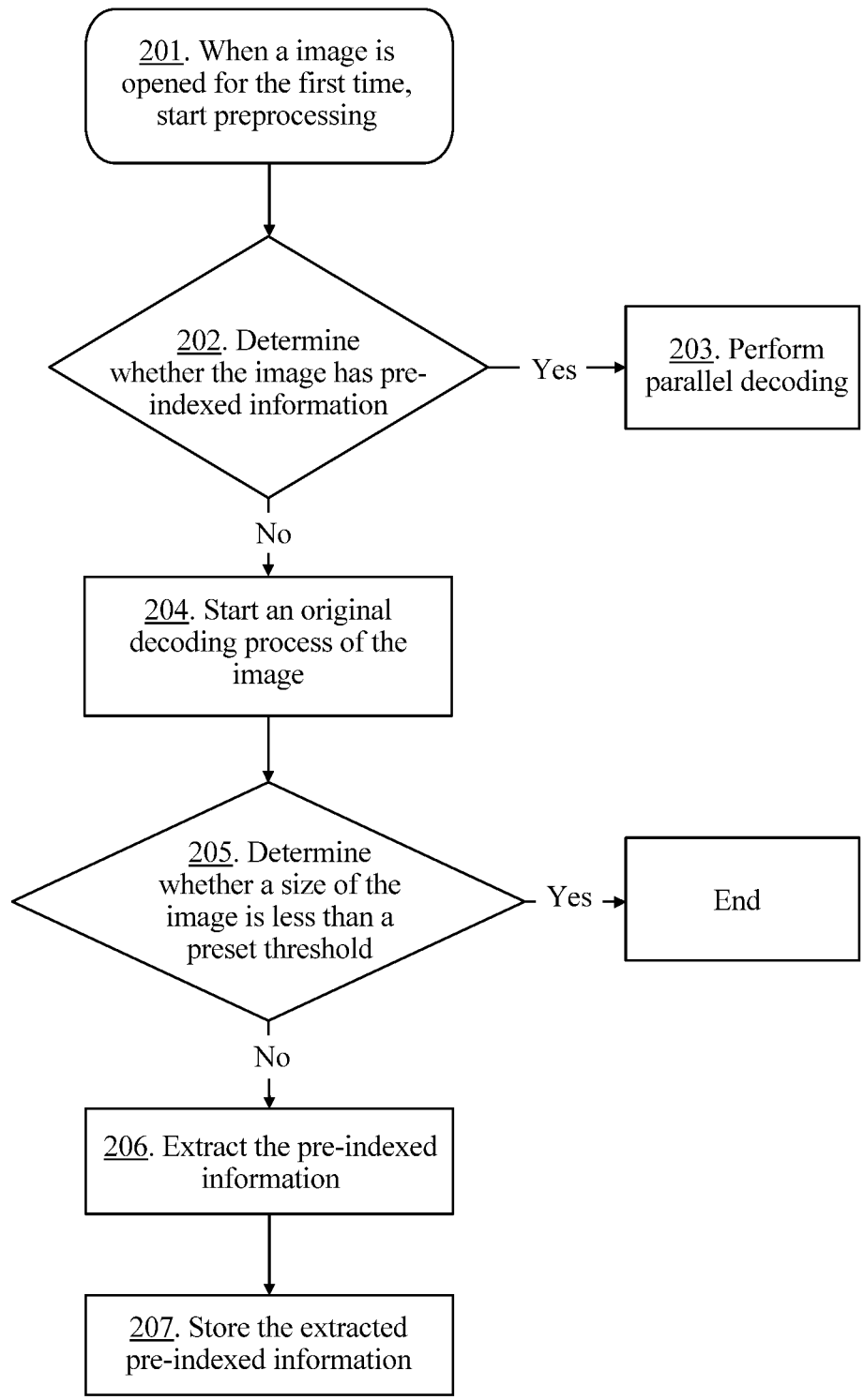
FIG. 3 is a schematic diagram of a pre-indexed information obtaining process in a decoding method according to an embodiment of the present disclosure.

Referring to FIG. 3, FIG. 3 is a schematic diagram of a pre-indexed information obtaining process in a decoding method according to an embodiment of the present disclosure.

Step 201: When it is detected that an image is opened for the first time, for example, when it is detected that a user taps the image, start preprocessing of the image. "Preprocessing" mentioned in this embodiment of the present disclosure refers to a process of extracting pre-indexed information.

In some other embodiments, an occasion of starting a preprocessing stage may also be a time when the image is newly added or the image is modified. Specifically, the operating system detects that the image is newly added or modified, for example, a media provider mechanism in an Android system provides a detection function. For example, a case in which the image is newly added includes obtaining an image by means of photographing by using a local camera, downloading an image from a network to the local machine, copying an image from another terminal device to the local machine, or editing a local image and saving an edited image as a new image. A case in which the image is updated includes a case in which image content is modified without saving the image as another image. Preprocessing in the two cases may include only serial Huffman entropy decoding.

In some other embodiments, preprocessing may also be autonomously started by the operating system. For example, it may be set that each time a quantity of newly-added images reaches ten, the operating system autonomously performs serial Huffman entropy decoding on the ten newly-added images, so as to extract the pre-indexed information.

Step 202: Determine whether the image already has the pre-indexed information. In this embodiment of the present disclosure, the pre-indexed information is stored in an extended attribute of a file system corresponding to the image, and the extended attribute of the file system includes a metadata file corresponding to the image. In some other embodiments, the pre-indexed information may also be stored in another type of file or a tail end of the image.

If the pre-indexed information can be read from the metadata file corresponding to the image, step 203 is performed. Step 203 means that preprocessing ends and a parallel decoding stage starts. If the pre-indexed information cannot be obtained from the metadata corresponding to the image or obtained pre-indexed information is empty, step 204 is performed.

In some other embodiments, a determining step, that is, step 202, may not be performed, that is, there is no pre-indexed information by default when all images are opened for the first time.

Step 204: Start an original decoding process of the image. If a current to-be-decoded image has no pre-indexed information, original decoding processes such as serial decoding, inverse discrete cosine transform, and color transform of the image are normally started and performed.

Step 205: Determine whether a size of the image is less than a preset threshold. If the size of the image is less than the preset threshold, the preprocessing ends, that is, the pre-indexed information is no longer obtained. However, an original decoding process of the image still needs to continue because the image still needs to be opened and displayed on a display screen under an open command of the user. If the size of the image is greater than or equal to the preset threshold, continue to perform step 206.

A major consideration of step 205 is that no great benefits can be obtained by performing parallel decoding on an excessively small image, and it is unnecessary to obtain the pre-indexed information. This may effectively save storage space. In some other embodiments, the step of determining the size of the image and the step of starting the original decoding process of the image may be performed interchangeably in order.

Step 206: Extract the pre-indexed information.

If the image is obtained by means of Huffman coding, after step 204, Huffman serial decoding is performed on the image. After the Huffman serial decoding is performed, offset location information of all MCU blocks is generated, and the pre-indexed information used in the method provided in this embodiment of the present disclosure includes offset location information of one or more MCU blocks thereof. In addition, if differential coding is performed (Huffman coding is further performed after differential coding is performed) on the image, the pre-indexed information further needs to include a DC (Direct Current) variable value of a previous MCU block respectively corresponding to the one or more MCU blocks, so as to use the DC variable value to correct a Huffman decoding result.

Specifically, in a Huffman serial decoding manner, serial processing is performed on all MCUs in the image in sequence, and after processing is completed or in this processing process, offset location information of N MCU blocks is extracted according to a specific interval. For example, because currently a mobile terminal generally has four cores, generally only four threads can be simultaneously started to perform parallel decoding. In this case, the to-be-decoded image needs to be divided into four data segments, and offset location information of N=4 MCU blocks needs to be extracted (for a purpose of understanding, refer to FIG. 1). In this embodiment, a decoding boundary includes a first MCU block of the image, and in some other embodiments, a decoding boundary may not include a first MCU block of the image.

To avoid a phenomenon that multiple threads wait for one thread, when multiple data segments that are to be decoded in parallel are divided, it is optimal to ensure that amounts of data in the multiple data segments are equal, so that the multiple threads can almost simultaneously complete decoding. Specifically, in an implementation, 1/N of a height of the image is used as an interval to obtain offset location information of the N MCU blocks, and in this manner, it is assumed that each MCU block has an equal amount of data; or in another implementation, 1/N of a length of the image (an overall offset of a file stream corresponding to the image) is used as an interval to obtain offset location information of the N MCU blocks, and in this manner, a sum of obtained offsets of the N MCUs is an offset of the entire image.

Step 207: Store the extracted pre-indexed information. The storing step may be performed after extraction of the offset location information of the multiple MCUs is completed, or when offset location information of one MCU is extracted, the storing step may be performed once.

Step 202 illustrates that the pre-indexed information may be stored in a metadata file of the image. In some other embodiments, the pre-indexed information may also be inserted into a tail end of the image, a database file associated with the image, or a file that belongs to a same directory as the image and that has a same file name as the image and an extension different from that of the image. In some other embodiments, to ensure integrity of the pre-indexed information, a field for integrity verification may be further added to the pre-indexed information before the pre-indexed information is stored.

It should be noted that, all the foregoing storage manners are persistent storage, for example, the pre-indexed information is stored in an external memory (for example, a hard disk) in a form of a file. This can ensure that the pre-indexed information is not lost when power outage occurs. However, in some other embodiments, if the pre-indexed information may be lost, it is unnecessary to forcibly perform persistent storage on the pre-indexed information.

It may be learned that, using the foregoing storage method avoids a process of replicating the entire image when the pre-indexed information is inserted into a header of the image, so as to effectively reduce an I/O operation. Particularly, when the system stores many images or a single image is relatively large, using the method in this embodiment of the present disclosure reduces many I/O operations, so as to avoid a frame freezing phenomenon or an apparent death phenomenon of the system to some extent. In addition, in a process of opening the image for the first time, along with an original decoding process of the image, the pre-indexed information is extracted and stored for next use. This may avoid increasing excessive extra power consumption due to extraction of the pre-indexed information.

It should be noted that, steps 206 and 207 may be performed after the original decoding process is completed, or may be performed along with step 204, that is, the original decoding process of the image. Specifically, in a process of performing Huffman serial decoding on the image, with an increase of decoded MCU blocks, offset location information of the MCU block is extracted according to a preset interval and stored.

The foregoing embodiment roughly describes a process of extracting a pre-index, and by using an image that is obtained by means of differential coding and Huffman coding as an example, the following describes composition of the pre-indexed information and a specific manner of extracting the pre-indexed information.

If the image is obtained by means of differential coding, the pre-indexed information needs to include at least the offset location information of the MCU block and a DC variable value of a previous MCU block of the MCU block. In an actual decoding process, some other information that needs to be stored may be further included. This is less related to this embodiment of the present disclosure, and details are not described.

Currently, a JPEG decoding library (libjpeg) in a Linux system already provides a capability of serial decoding and region decoding, and index information of all MCU blocks in the image may be extracted by means of serial decoding or region decoding. It may be learned by comparison that, the index information includes the pre-indexed information required in this embodiment of the present disclosure, and therefore, a data structure Huffman_offset_data that is defined by the index information may be used as a data structure used in a pre-indexing solution. A parameter and a meaning of the structure Huffman_offset_data are shown in Table 1, and a "data block" in this table refers to an MCU block in this embodiment of the present disclosure.

TABLE 1

Example of a data structure of the pre-indexed information

| Name of status data | Meaning of status data |
|---|---|
| prev_dc array | Recording DC variable values corresponding to three color channels of a previous data block |
| EOBRUN | A quantity of intervals between a current data block and a global first data block |
| get_buf | A current byte buffer of a Huffman decoder |
| restarts_to_go | A quantity of intervals for accumulative restarts during differential coding |
| next_restart_num | A next start target for an accumulative restart during differential coding |
| bitstream_offset | Recording a location offset that is of the data block and that is in a file stream |

The index information of all the MCU blocks is obtained by using the capability provided by the JPEG decoding library, index information of each MCU block is stored in a form of the foregoing data structure, and parameters included in the data structure may be determined according to an actual requirement. All the index information may exist in a form of a two-dimensional array [X, Y], where X indicates a row number of the MCU block in the image, and Y indicates a specific location of the MCU block in a row. Then, index information of an appropriate quantity of MCU blocks is selected from the two-dimensional array according to a requirement, so as to form pre-indexed information required for parallel decoding, and persistent storage is performed on the pre-indexed information. Specifically, in an implementation, 1/N of a total quantity of rows in the array is used as an interval to select N pieces of pre-indexed information, so as to perform persistent storage.

Figure 4:
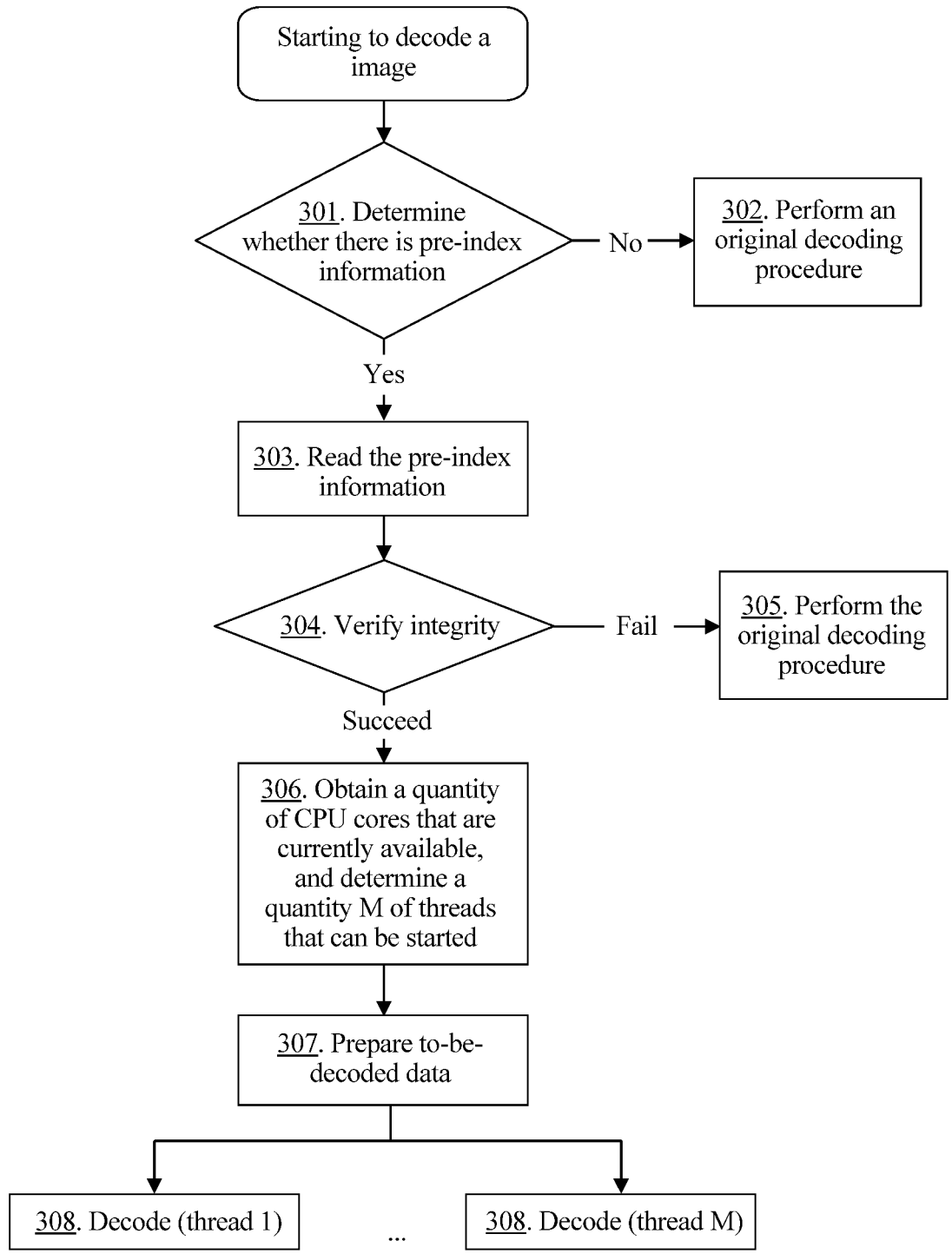
FIG. 4 is a schematic flowchart of a parallel decoding method according to an embodiment of the present disclosure.

Referring to FIG. 4, FIG. 4 is a schematic flowchart of a parallel decoding method according to an embodiment of the present disclosure. After pre-indexed information of an image is extracted and stored by using the foregoing method, the parallel decoding method provided in this embodiment of the present disclosure may be used when the image further needs to be decoded (a user opens the image again) next time.

Step 301: Determine whether a to-be-decoded image has pre-indexed information. If the to-be-decoded image has no pre-indexed information, an original decoding procedure 302 is performed. In this embodiment of the present disclosure, the original decoding procedure is a serial decoding procedure. If the to-be-decoded image has the pre-indexed information, step 303 is performed.

Step 303: Read the pre-indexed information. In this embodiment of the present disclosure, the read pre-indexed information includes information about N decoding boundaries. The information about the N decoding boundaries is corresponding to N data segments that are in the to-be-decoded image and that may be processed in parallel.

In some other embodiments, because there is always a thread that starts decoding from a first MCU block of the to-be-decoded image, offset location information of the first MCU block of the to-be-decoded image may be not recorded. That is, by recording only information about (N−1) decoding boundaries, N data segments may be obtained when parallel processing is performed.

A manner of reading the pre-indexed information is related to a storage location of the pre-indexed information. The foregoing embodiment describes the possible storage location, and a corresponding reading manner belongs to the prior art. Therefore, details are not described in this embodiment of the present disclosure again.

It should be noted that, step 301 and step 303 may be combined into one step. That is, whether the to-be-decoded image has the pre-indexed information is determined by reading the pre-indexed information. If the pre-indexed information can be read, step 304 is directly performed. If the pre-indexed information cannot be read or a reading result is empty, step 302 is performed.

In some other embodiments, before the pre-indexed information is read, a step of determining a size of the to-be-decoded image may be further included. If the size of the to-be-decoded image is less than a preset threshold, the original decoding procedure is performed. Otherwise, after the pre-indexed information is read, a parallel decoding procedure is performed, or if the pre-indexed information cannot be read, the original decoding procedure is performed. Information about the size of the to-be-decoded image is stored in a header of the image, and the information about the size of the image may be obtained by parsing the header of the image, which is specifically an SOF (Start of Frame, start of frame) marker.

Step 304: Verify integrity of the read pre-indexed information. In this embodiment of the present disclosure, a secure hash algorithm (Secure Hash Algorithm, SHA) is used to verify the integrity of the pre-indexed information. If verification fails, it indicates that the pre-indexed information is lost or modified. In this case, to ensure accuracy of decoding the image, an original decoding procedure in step 305 is performed. If verification succeeds, step 306 is performed.

In some other embodiments, a message digest algorithm 5 (or referred to as an MD5 algorithm) may be further used to perform integrity check on the pre-indexed information, or another type of integrity check algorithm is used.

In some other embodiments, step 304 may be not performed, that is, all pre-indexed information is complete by default. Alternatively, before the pre-indexed information is stored, a means such as encryption may be used to ensure that the pre-indexed information is not altered, and the pre-indexed information only needs to be decrypted before being used. It should be noted that, to perform integrity verification, after the pre-indexed information is extracted and before the pre-indexed information is stored, an extra verification field needs to be added to the pre-indexed information. This belongs to an existing integrity verification technology, and details are not described in this embodiment of the present disclosure.

Step 306: Obtain a quantity Q of currently available (idle) CPU cores, and determine a quantity M of threads that can be simultaneously started, where M=min(N, Q). When N is less than or equal to Q, M=N, and each thread processes one data segment. When N is greater than Q, M=Q, each thread except a last thread processes N/Q (rounding off) data segments, and the last thread processes a remaining part.

Step 307: Prepare to-be-decoded data. A file stream corresponding to the to-be-decoded image is replicated. It should be noted that, herein, replicating the file stream is replicating only a pointer of the file stream instead of replicating the entire file stream. Optionally, when the solution is implemented by using a JPEG decoding library in a Linux system, decoding structures whose quantity is equal to a quantity of threads that perform parallel decoding further need to be created. The decoding structure is a structure designed by the JPEG decoding library for a decoding operation, and includes a pre-declared variable such as a quantization table and a color channel. This can ensure that decoding structures corresponding to threads do not share a variable between each other, so that a same variable is not repeatedly changed in a multi-thread process.

Preparing the to-be-decoded data can ensure that each thread has its own file stream pointer and decoding structure. This may avoid a mutual interference problem caused because the thread modifies data in the file stream or the decoding structure in the decoding process. In addition, creation of the decoding structure is a memory operation and does not affect I/O, and replicating the file stream is replicating only the pointer of the file stream instead of replicating the entire file stream. Therefore, parallel decoding efficiency is not affected.

Step 308: Multiple threads perform parallel decoding. A JPEG image is used as an example. Each thread completes stages of index location restoration, Huffman entropy decoding, inverse discrete cosine transform (IDCT), and color transform in sequence, and finally outputs an RGB result for a partial area of the image.

All threads perform data synchronization after completing processing, that is, integrate a processing result of each thread. When integration is performed, extra data copy overheads may be avoided in a memory pointer manner. Specifically, all the threads use, as an input location, a location of a pointer that points to a designated location of a target memory, and decoding results of all the threads are directly output to the designated location of the target memory. This may avoid data copy overheads caused because the decoding result is output to temporary memory space and is further copied to target memory space.

The foregoing steps except step 308 may be completed by using one primary thread, and step 308 may be completed by using multiple sub-threads.

The foregoing mainly describes a specific procedure of the method provided in this embodiment of the present disclosure. With reference to FIG. 5a, FIG. 5b, FIG. 6a, and FIG. 6b, the following uses an Android operating system as an example to describe an implementation location and a runtime status of the method provided in this embodiment of the present disclosure. For a more specific procedure of the method, refer to the foregoing embodiment.

Figure 5A:
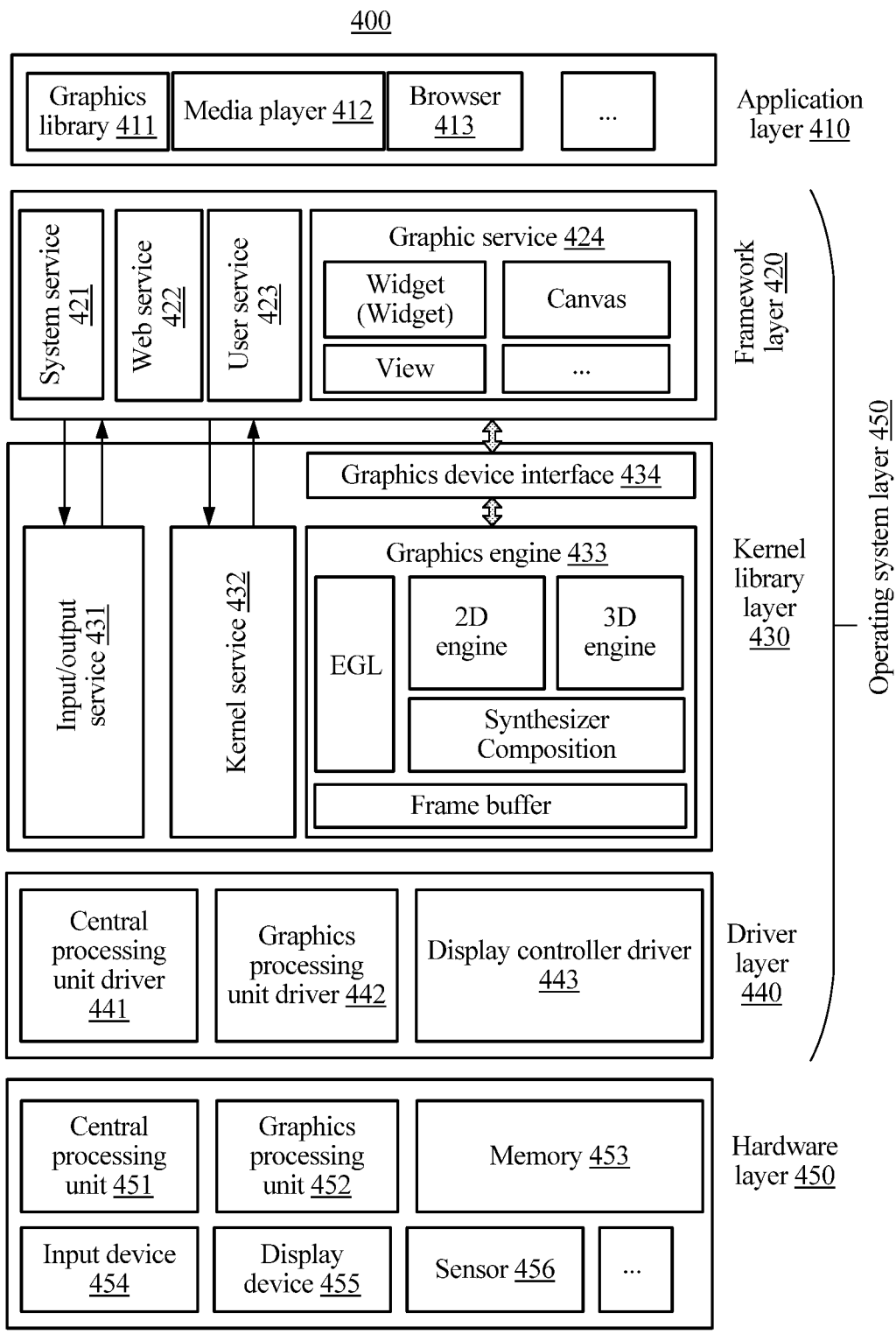
FIG. 5a is a schematic structural diagram of a computer system according to an embodiment of the present disclosure.

Referring to FIG. 5a, FIG. 5a is a schematic structural diagram of a computer system 400 according to an embodiment of the present disclosure. The computer system 400 may be a terminal device or another type of computer device. The computer system includes an application layer 410 and an operating system layer 450, and the operating system may be an Android operating system. The operating system layer 450 is further divided into a framework layer 420, a kernel library layer 430, and a driver layer 440. The operating system layer 450 in FIG. 5 may be considered as a specific implementation of the operating system 182 in FIG. 1. The application layer 410 in FIG. 5 may be considered as a specific implementation of an application program 181 in FIG. 1. The driver layer 440 includes a CPU driver 441, a GPU driver 442, a display controller driver 443, and the like. The kernel library layer 430 is a core part of the operating system, and includes an input/output service 431, a kernel service 432, a graphics device interface 434, a graphics engine 433 that implements CPU or GPU graphics processing, and the like. The graphics engine 433 may include a 2D engine, a 3D engine, a synthesizer (or Composition), a frame buffer, an EGL (Embedded-System Graphics Library), and the like. The EGL is an interface between a rendering API and an underlying original platform window system, and the API is an application programming interface. The framework layer 420 may include a graphic service 424, a system service 421, a web service 422, a customer service 423, and the like. The graphic service 424 may include a widget a canvas, views, and the like. The application layer 410 may include a graphics library 411, a media player 412, a browser 413, and the like.

In addition, under the driver layer 440, the computer system 400 further includes a hardware layer 450. The hardware layer of the computer system 400 may include a central processing unit (CPU) 451 and a graphic processing unit (GPU) 452 (equivalent to a specific implementation of the processor 150 in FIG. 1); may further include a memory 453 (equivalent to the memory 180 in FIG. 1), including an internal memory and an external memory; may further include an input device 454 (equivalent to an input device 132 in FIG. 1), a display device 455 (equivalent to a display device 140 in FIG. 1), for example, a liquid crystal display (LCD), a holographic device, and a projector; and may further include one or more sensors 456 (equivalent to the sensor 120 in FIG. 1). Certainly, in addition, the hardware layer 450 may further include a power supply, a camera, an RF circuit, and a WiFi module that are shown in FIG. 1, and may further include another hardware module that is not shown in FIG. 1, for example, a memory controller and a display controller.

The method provided in any one of the foregoing embodiments of the present disclosure may be implemented in a 2D engine shown in FIG. 5a.

Figure 5B:
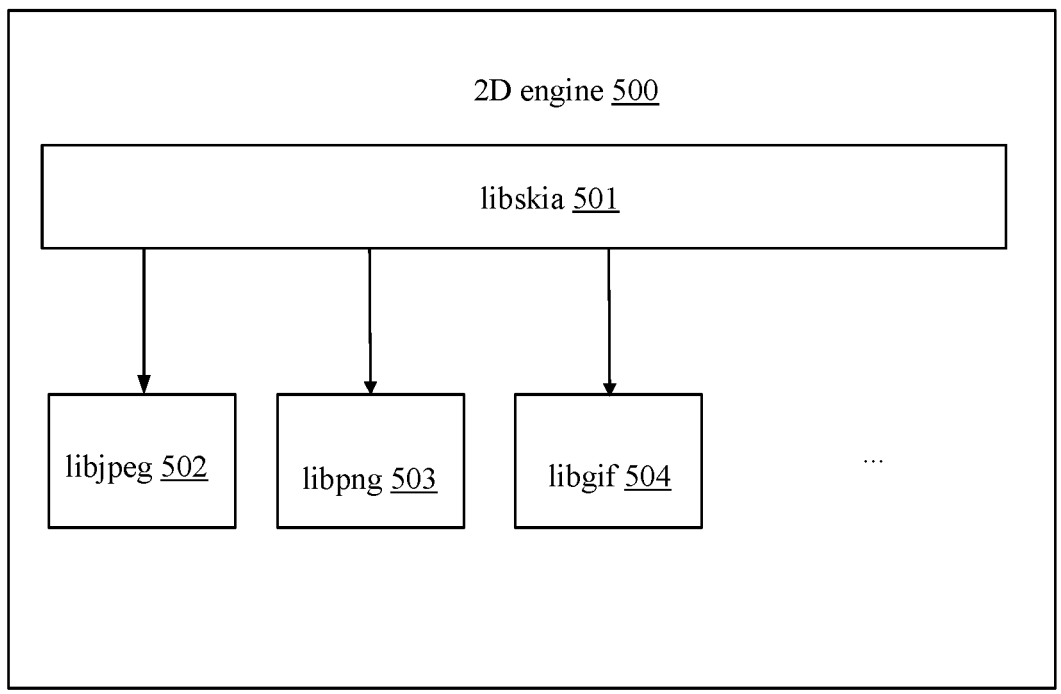

Referring to FIG. 5b, FIG. 5b is a schematic structural diagram of the 2D engine shown in FIG. 5a. As shown in FIG. 5b, the 2D engine 500 mainly includes libskia 501 and libjpeg 502, the libskia 501 may invoke a function provided by the libjpeg 502, and the libjpeg 502 is equivalent to the JPEG decoding library mentioned in the foregoing embodiment. In this embodiment of the present disclosure, a parallel decoding function is mainly added to the libjpeg 502, and an interface for invoking the libjpeg 502 by the libskia 501 is adaptively modified. In addition, the 2D engine 500 may further include a decoding library in another image format, for example, libpng 503 and libgif 504.

Figure 6A:
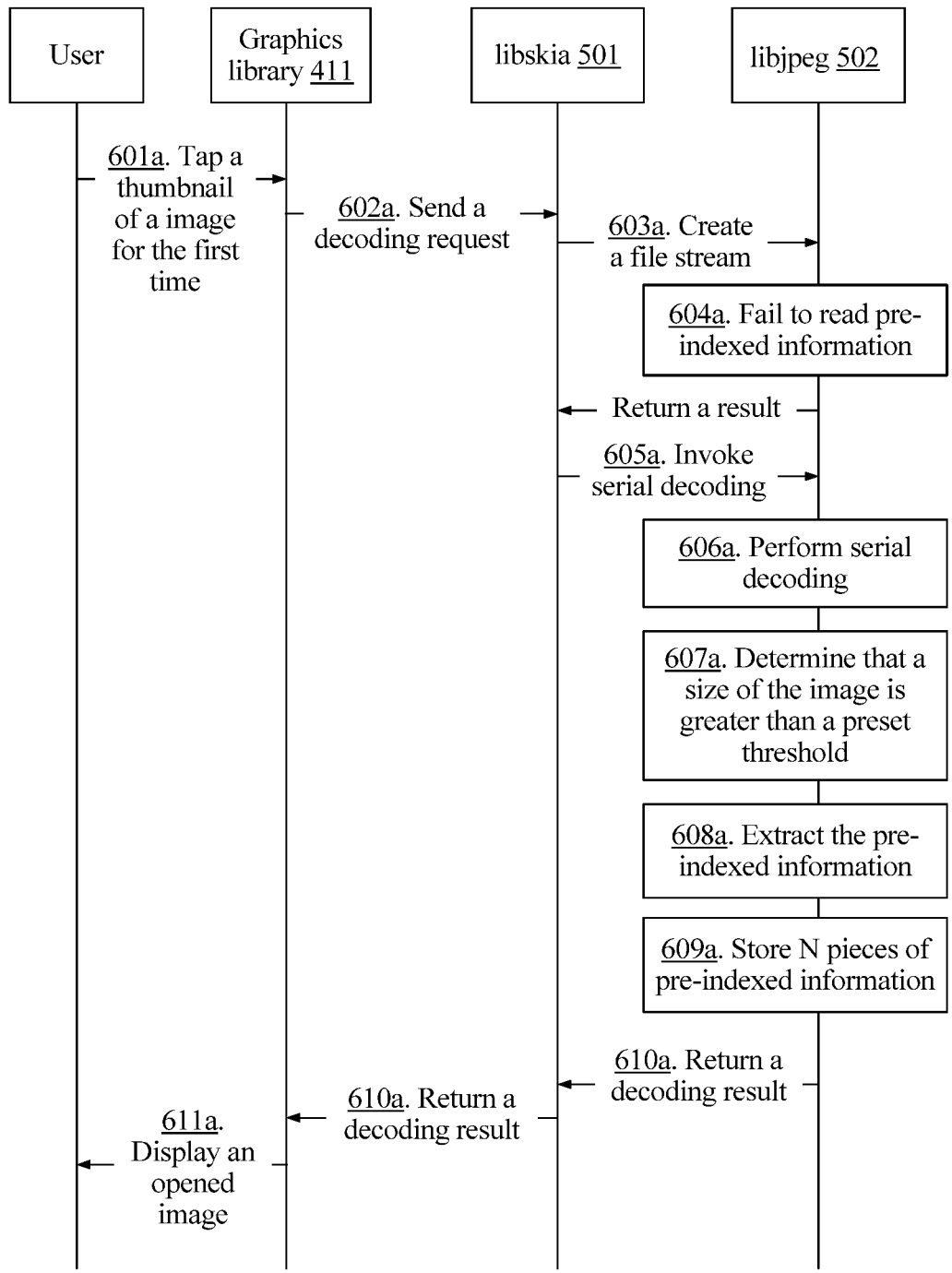
FIG. 6a and FIG. 6b are operating sequence diagrams of a parallel decoding method according to an embodiment of the present disclosure.
Figure 6B:
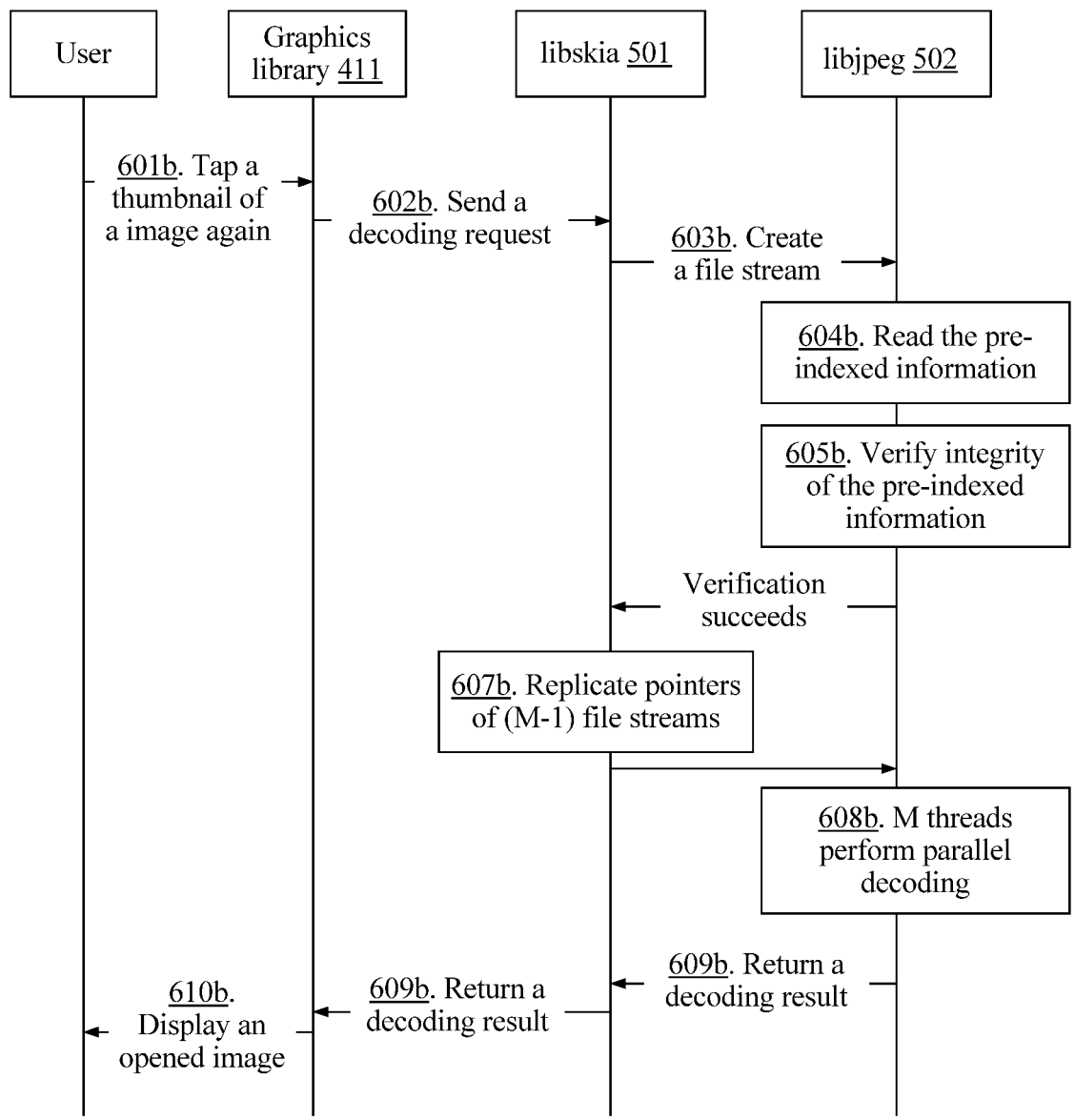

FIG. 6a and FIG. 6b are operating sequence diagrams of a parallel decoding method in a 2D engine 500 according to an embodiment of the present disclosure. FIG. 6a shows a process of obtaining pre-indexed information, and FIG. 6b shows a process of performing parallel decoding according to the pre-indexed information. In both of the two operating sequence diagrams, that a user taps a thumbnail of an image in the graphics library 411 (referring to FIG. 5a) is used as an example for description.

As shown in FIG. 6a, when the user taps the thumbnail of the image for the first time (601a), the graphics library 411 sends a decoding request to libskia 501 (602a), and the libskia 501 creates a file stream of the image and sends the file stream to libjpeg 502 (603a). After failing to read the pre-indexed information (604a), the libjpeg 502 returns, to the libskia 501, a result indicating a failure to obtain the pre-indexed information. The libskia 501 invokes, according to the returned result, a serial decoding function that is provided by the libjpeg 502 (605a), and the libjpeg 502 performs a process such as serial Huffman decoding on the foregoing file stream (606a). Further, when determining that a size of the image is greater than a preset threshold (607a), the libjpeg 502 extracts the pre-indexed information (608a) according to a decoding result in step 606a, and stores the extracted pre-indexed information (609a). After completing decoding of the image, the libjpeg 502 returns the decoding result to the graphics library 411 (610a) by using the libskia 501, and then the graphics library 411 displays an opened image for the user (611a).

In this embodiment of the present disclosure, serial Huffman decoding is performed by the libjpeg 502, and therefore, the libjpeg 502 may directly extract the pre-indexed information from the decoding result. However, in some other embodiments, to minimize code modification for an original decoding procedure, after performing decoding, the libjpeg 502 sends, to the libskia 501, offset location information that is obtained by decoding and that is of all MCU blocks. The libskia 501 then sends index information of all the MCU blocks to the libjpeg 502, and the libjpeg 502 then extracts the pre-indexed information from the information.

In some other embodiments, step 605a and step 606a may be replaced by region decoding. Because extracting the offset location information of all the MCU blocks is performed before a decoding step during region decoding, step 607a and step 608a may be performed before region decoding.

As shown in FIG. 6b, after the user taps the thumbnail of the image (601b), the graphics library 411 sends a decoding request to the libskia 501 (602b). The libskia 501 creates a file stream of the image, and transmits the file stream to the libjpeg 502 (603b). The libjpeg 502 reads the pre-indexed information (604b), verifies integrity of the pre-indexed information (605b), and then returns, to the libskia 501, a result indicating that the verification succeeds. The libskia 501 makes preparations for decoding (607b), including processes of replicating pointers and the like of (M−1) files (M is a quantity of threads that are simultaneously started), invoking the libjpeg 502 after replication is completed, and invoking M threads by the libjpeg to perform parallel decoding on the foregoing file stream (608b). After completing decoding of the image, the libjpeg 502 returns the decoding result to the graphics library 411 (609b) by using the libskia 501, and then the graphics library 411 displays an opened image for the user (610b). In addition, in an implementation process, in addition to reading the pre-indexed information, the libjpeg 502 further reads description information (for example, a quantization table and a size of the file) of an image file. This belongs to the prior art and details are not described herein. That the graphics library 411 invokes the libskia 501 in the 2D engine may be specifically implemented by invoking a BitmapFactory interface in a graphics device interface 434 (referring to FIG. 5a). This also belongs to the prior art and details are not described in this embodiment of the present disclosure.

It should be noted that, the operating sequence diagrams provided in FIG. 6a and FIG. 6b are only examples for describing the method embodiment provided in the present disclosure. A person skilled in the art may easily derive, from multiple methods and examples of the two operating sequence diagrams that are described in the foregoing embodiment of the present disclosure, an operating sequence diagram corresponding to another method embodiment provided in the present disclosure and a corresponding program implementation according to the sequence diagram. Details are not described herein.

It may be learned from the above-described apparatus and method that, a computer system to which the parallel decoding method provided in this embodiment of the present disclosure is applied may implement parallel decoding on the file, improve decoding efficiency, and effectively avoid a system frame freezing phenomenon, thereby improving user experience.

Figure 7A:
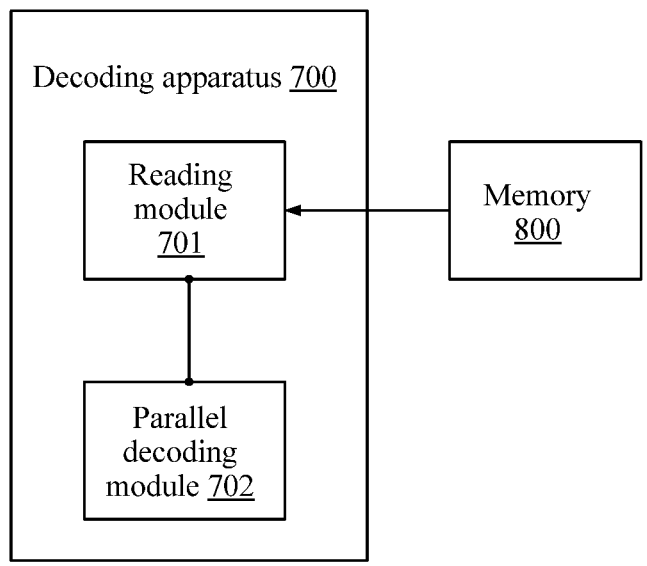
FIG. 7a to FIG. 7c are schematic structural diagrams of a decoding apparatus according to an embodiment of the present disclosure.

Referring to FIG. 7a, FIG. 7a is a schematic structural diagram of a decoding apparatus 700 according to an embodiment of the present disclosure. The decoding apparatus 700 includes: a reading module 701, configured to read pre-indexed information corresponding to a to-be-decoded file from a memory 800, where the pre-indexed information includes information indicating one or more decoding boundaries, and the pre-indexed information is stored in another file associated with the to-be-decoded file or a tail end of the to-be-decoded file; and a parallel decoding module 702, configured to perform parallel decoding on multiple data segments in the to-be-decoded file according to the pre-indexed information, where the multiple data segments are divided according to one or more of the one or more decoding boundaries. The memory 800 includes an internal memory and an external memory, and the pre-indexed information is usually stored in the external memory.

Figure 7B:
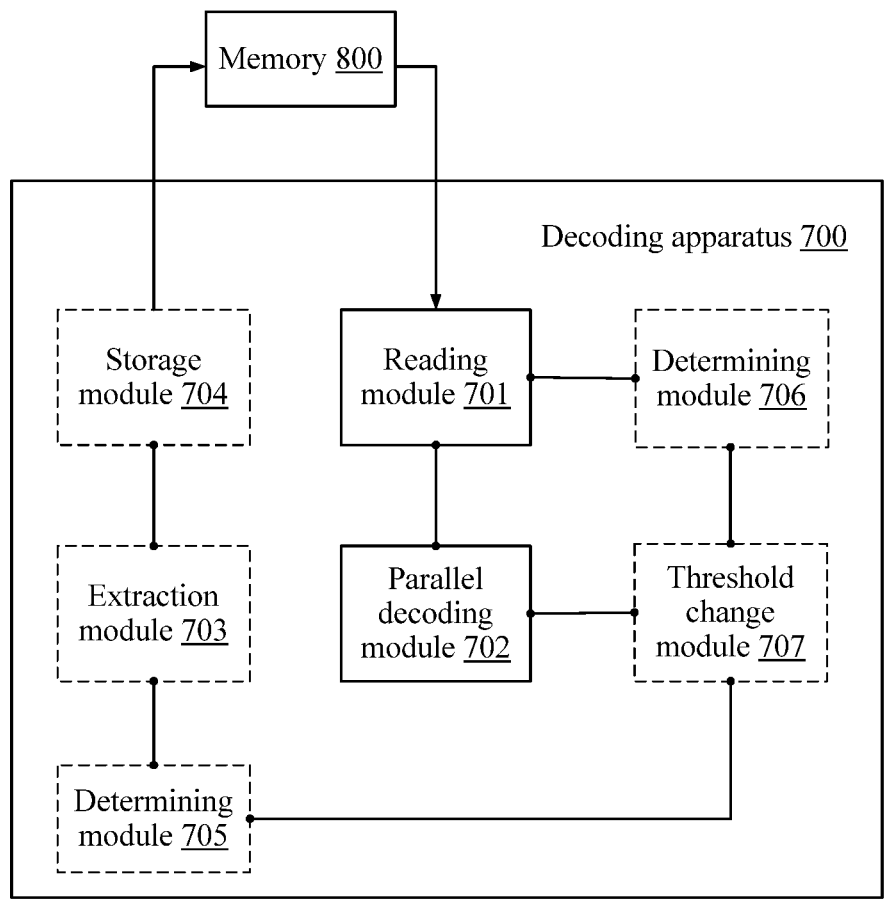

Further, as shown in FIG. 7b, the decoding apparatus 700 may further include an extraction module 703 configured to: when it is detected that the to-be-decoded file is newly added, modified, or opened for the first time, extract the pre-indexed information; and a storage module 704, configured to store the extracted pre-indexed information in the memory 800.

Still further, the decoding apparatus 700 may further include either or both of a determining module 705 and a determining module 706, and both of the two determining modules are configured to determine that a size of the file is greater than the preset threshold. The extraction module 703 and the reading module 701 respectively perform a corresponding extraction operation and a corresponding reading operation according to a determining result. Further, the decoding apparatus 700 may further include a threshold change module 707, configured to change the threshold in the determining module 705 and the determining module 706. In some other embodiments, the determining module 705 and the determining module 706 may be combined into one module.

Figure 7C:
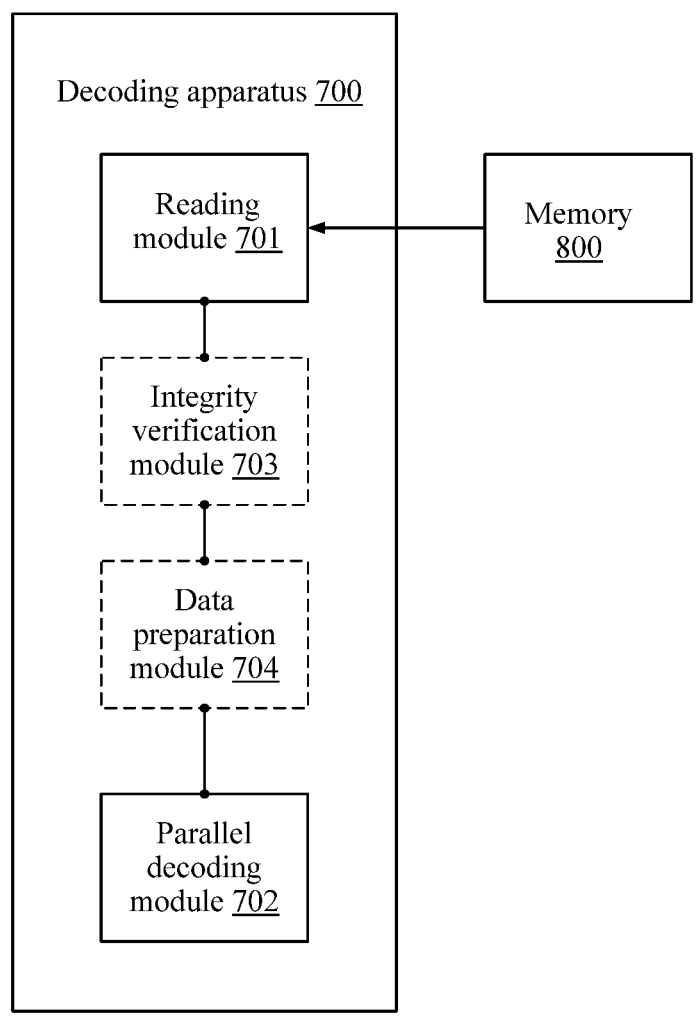

On the basis of FIG. 7a, as shown in FIG. 7c, the decoding apparatus 700 may further include an integrity verification module 703 configured to verify integrity of the pre-indexed information that is read by the reading module 701, and the parallel decoding module 702 further performs parallel decoding on the file when a verification result of the integrity verification module 703 indicates that the pre-indexed information passes verification. Further, the decoding apparatus 700 may further include a data preparation module 704, configured to replicate a file stream of the to-be-decoded file to obtain a quantity of file streams that is equal to a quantity of multiple threads that are to perform parallel decoding, where replicating the file stream refers to replicating a pointer of the file stream. It may be learned from description in the foregoing method embodiment that, the data preparation module 704 may further replicate or create, according to a requirement, other information required for parallel decoding.

It should be noted that, the integrity verification module 703 and the data preparation module 704 may be added on the basis of the decoding apparatus shown in FIG. 7b. All modules represented by dashed lines in FIG. 7a to FIG. 7c are optional modules.

The described apparatus embodiment is merely an example. The units described as separate parts may or may not be physically separate, and parts displayed as units may or may not be physical units, may be located in one position, or may be distributed on a plurality of network units. Some or all the modules may be selected according to actual needs to achieve the objectives of the solutions of the embodiments. In addition, in the accompanying drawings of the apparatus embodiments provided by the present disclosure, connection relationships between modules indicate that the modules have communication connections with each other, which may be specifically implemented as one or more communications buses or signal cables. A person of ordinary skill in the art may understand and implement the embodiments of the present disclosure without creative efforts.

Based on the foregoing descriptions of the embodiments, a person skilled in the art may clearly understand that the present disclosure may be implemented by software in addition to necessary universal hardware or by dedicated hardware only, including a dedicated integrated circuit, a dedicated CPU, a dedicated memory, a dedicated component and the like. Generally, any functions that can be performed by a computer program can be easily implemented by using corresponding hardware. Moreover, a specific hardware structure used to achieve a same function may be of various forms, for example, in a form of an analog circuit, a digital circuit, a dedicated circuit, or the like.

The foregoing descriptions are merely specific implementations of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A decoding method, comprising:
   reading pre-indexed information corresponding to a to-be-decoded file, wherein the to-be-decoded file is based on variable-length coding, and wherein the pre-indexed information comprises information indicating one or more decoding boundaries
   storing pre-indexed information in a file associated with the to-be-decoded file or at a tail end of the to-be-decoded file; and
   performing parallel decoding on a plurality of data segments in the to-be-decoded file according to the pre-indexed information, wherein the data segments are divided according to one or more of the one or more decoding boundaries.

2. The method of claim 1, wherein before reading pre-indexed information corresponding to the to-be-decoded file, the method further comprises:
   extracting the pre-indexed information in response to detecting that the to-be-decoded file is newly added, modified, or opened for a first time; and
   storing the extracted pre-indexed information.

3. The method of claim 2, further comprising determining a quantity of decoding boundaries that are indicated by the extracted pre-indexed information according to a processing capability of a processing resource.

4. The method of claim 1, wherein before performing parallel decoding on the multiple data segments in the to-be-decoded file according to the pre-indexed information, the method further comprises replicating a file stream of the to-be-decoded file to obtain a quantity of file streams that is equal to a quantity of a plurality of threads that are to perform the parallel decoding, wherein replicating the file stream comprises replicating a pointer of the file stream.

5. The method of claim 1, wherein the file is a metadata file, a database file, or belongs to a same directory as the to-be-decoded file and has a common file name of the to-be-decoded file.

6. The method of claim 5, wherein the metadata file is a system file.

7. A computer system, comprising:
   a memory configured to store instructions; and
   a processor coupled to the memory and configured to execute the instructions, which cause the processor to be configured to:
      read pre-indexed information corresponding to a to-be-decoded file, wherein the to-be-decoded file is based on variable-length coding, and wherein the pre-indexed information comprises information indicating one or more decoding boundaries;
      store the pre-indexed information in a file associated with the to-be-decoded file or at a tail end of the to-be-decoded file; and
      perform parallel decoding on a plurality of data segments in the to-be-decoded file according to the pre-indexed information, wherein the data segments are divided according to one or more of the one or more decoding boundaries.

8. The computer system of claim 7, wherein the instructions further cause the processor to be configured to:
   extract the pre-indexed information when the to-be-decoded file is newly added, modified, or opened for a first time; and
   store the extracted pre-indexed information.

9. The computer system of claim 8, wherein the instructions further cause the processor to determine a quantity of decoding boundaries that are indicated by the extracted pre-indexed information according to a processing capability of a processing resource.

10. The computer system of claim 7, wherein the file is a metadata file, a database file, or belongs to a same directory as the to-be-decoded file and has a common file name of the to-be-decoded file.

11. The computer system of claim 10, wherein the metadata file is a system file.

12. A computer program product comprising instructions that are stored on a non-transitory computer-readable medium and that, when executed by a processor, cause a computer system to:
   read pre-indexed information corresponding to a to-be-decoded file, wherein the to-be-decoded file is based on variable-length coding, and wherein the pre-indexed information comprises information indicating one or more decoding boundaries;
   store the pre-indexed information in a file associated with the to-be-decoded file or at a tail end of the to-be-decoded file; and
   perform parallel decoding on a plurality of data segments in the to-be-decoded file according to the pre-indexed information, wherein the data segments are divided according to one or more of the one or more decoding boundaries.

13. The non-transitory storage medium of claim 12, wherein the instructions, stored on the non-transitory computer-readable medium, further cause the computer system to:
   extract the pre-indexed information when the to-be-decoded file is newly added, modified, or opened for a first time; and
   store the extracted pre-indexed information.

14. The non-transitory storage medium of claim 13, wherein the instructions, stored on the non-transitory computer-readable medium, further cause the computer system to determine a quantity of decoding boundaries that are indicated by the extracted pre-indexed information according to a processing capability of a processing resource.

15. A decoding method, comprising:
   reading pre-indexed information corresponding to a to-be-decoded file in response to determining that a size of the to-be-decoded file is greater than a preset first threshold, wherein the to-be-decoded file is based on variable-length coding, and wherein the pre-indexed information comprises information indicating one or more decoding boundaries;
   storing the pre-indexed information in a file associated with the to-be-decoded file or at a tail end of the to-be-decoded file; and
   performing parallel decoding on a plurality of data segments in the to-be-decoded file according to the pre-indexed information, wherein the data segments are divided according to one or more of the one or more decoding boundaries.

16. A decoding method, comprising:
   extracting pre-indexed information in response to determining that a to-be-decoded file is newly added, modified, or opened for a first time, and that a size of the to-be-decoded file is greater than a preset first threshold, wherein the to-be-decoded file is based on variable-length coding, and wherein the pre-indexed information comprises information indicating one or more decoding boundaries;
   storing the extracted pre-indexed information in a file associated with the to-be-decoded file or at a tail end of the to-be-decoded file;
   reading the pre-indexed information;
   performing parallel decoding on a plurality of data segments in the to-be-decoded file according to the pre-indexed information, wherein the data segments are divided according to one or more of the one or more decoding boundaries.

17. The method of claim 16, further comprising changing the preset first threshold to a size of a current to-be-decoded file in response to determining that parallel decoding is performed on the current to-be-decoded file, wherein a decoding time is less than a preset second threshold, and wherein a size of a target to-be-decoded file is greater than the preset first threshold.

18. A computer system, comprising:
   a memory configured to store instructions; and
   a processor coupled to the memory and configured to execute the instructions, which cause the processor to be configured to:
      read pre-indexed information corresponding to a to-be-decoded file when a size of the to-be-decoded file is greater than a preset first threshold, wherein the to-be-decoded file is based on variable-length coding, wherein the pre-indexed information comprises information indicating one or more decoding boundaries;
      store the pre-indexed information in a file associated with the to-be-decoded file or at a tail end of the to-be-decoded file; and
      perform parallel decoding on a plurality of data segments in the to-be-decoded file according to the pre-indexed information, wherein the data segments are divided according to one or more of the one or more decoding boundaries.

19. The computer system of claim 17, wherein the file is a metadata file, a database file, or belongs to a same directory as the to-be-decoded file and has a common file name of the to-be-decoded file.

20. A computer system, comprising:
   a memory configured to store instructions; and
   a processor coupled to the memory and configured to execute the instructions, which cause the processor to be configured to:
      extract pre-indexed information when a to-be-decoded file is newly added, modified, or opened for the first time, and when a size of the to-be-decoded file is greater than a preset first threshold, wherein the to-be-decoded file is based on variable-length coding, the pre-indexed information comprises information indicating one or more decoding boundaries;
      store the extracted pre-indexed information in a file associated with the to-be-decoded file or at a tail end of the to-be-decoded file;
      read the pre-indexed information;
      perform parallel decoding on a plurality of data segments in the to-be-decoded file according to the pre-indexed information, wherein the data segments are divided according to one or more of the one or more decoding boundaries.

21. The computer system of claim 20, wherein the file is a metadata file, a database file, or belongs to a same directory as the to-be-decoded file and has a common file name of the to-be-decoded file.

* * * * *